(12) United States Patent
Schmokel

(10) Patent No.: US 6,804,353 B2
(45) Date of Patent: Oct. 12, 2004

(54) SPLITTER ASSEMBLY WITH HIGH DENSITY BACKPLANE BOARD

(75) Inventor: Paul W. Schmokel, Prior Lake, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 413 days.

(21) Appl. No.: 09/896,809

(22) Filed: Jun. 29, 2001

(65) Prior Publication Data

US 2003/0002656 A1 Jan. 2, 2003

(51) Int. Cl.[7] .............................. H04M 1/00; H04M 9/00
(52) U.S. Cl. ........................... 379/413.04; 379/413.01; 379/413.02; 379/413.03
(58) Field of Search ....................... 379/413.02–413.04

(56) References Cited

U.S. PATENT DOCUMENTS

| | | | | |
|---|---|---|---|---|
| 5,714,718 A | | 2/1998 | Tanaka | |
| 6,137,866 A | * | 10/2000 | Staber et al. | 379/413.04 |
| 6,181,004 B1 | * | 1/2001 | Koontz et al. | 257/691 |
| 6,192,399 B1 | * | 2/2001 | Goodman | 379/413.04 |
| 6,438,226 B1 | * | 8/2002 | Guenther et al. | 379/413.04 |
| 2002/0118820 A1 | * | 8/2002 | Sinclair et al. | 379/413.04 |
| 2002/0136392 A1 | * | 9/2002 | Witty et al | 379/413.04 |
| 2002/0136396 A1 | * | 9/2002 | Witty et al. | 379/413.03 |

FOREIGN PATENT DOCUMENTS

| | | |
|---|---|---|
| EP | 0 909 102 A2 | 4/1999 |
| JP | 04340795 | 11/1992 |
| WO | WO 01/45432 A1 | 6/2001 |
| WO | WO 01/80574 A2 | 10/2001 |
| WO | WO 01/97532 A2 | 12/2001 |

OTHER PUBLICATIONS

Application Ser. No. 09/549,133, filed Apr. 13, 2000.
"BroadWire™ 120: High Density ADSL Splitter", *ADC Telecommunications, Inc.*, 8 pages (Sep. 2000).
"BroadWire™ 240: High Density ADSL Splitter", *ADC Telecommunications, Inc.*, 8 pages (Sep. 2000).
"BroadWire™ 528: High Density ADSL Splitter", *ADC Telecommunications, Inc.*, 8 pages (Sep. 2000).
"DSL POTS Splitter Shelf Family", *Corning Cable Systems LLC*, 8 pages (Sep. 2000).
"High Density xDSL Central Office Splitter: PS–1000 Series", *Wilcom*, 2 pages (Apr. 2000).
"Product Information", *mPhase Technologies*, 3 pages (no date).
"Product Release: Wilcom Announces Highest Density CO ADSL POTS Splitter Series", *Wilcom*, 2 pages (Nov. 6, 2000).

(List continued on next page.)

*Primary Examiner*—Forester W. Isen
*Assistant Examiner*—Ramnandan Singh
(74) *Attorney, Agent, or Firm*—Merchant & Gould P.C.

(57) ABSTRACT

A telecommunications device including a plurality of splitter cards mounted in a chassis, a circuit board, and plurality of card edge connectors for providing electrical connections between the splitter cards and the circuit board, and POTS, LINE, and DATA connectors. The circuit board includes three layers, each layer having tracings that electrically connect at least one POTS, LINE, or DATA connector to at least one of the card edge connector. A center layer includes a grounding plane that is adapted to reduce cross-talk between tracings on a top layer and tracings on a bottom layer. The grounding plane is co-planar with tracings on the center layer such that the grounding plane adds additional thickness to the center layer.

16 Claims, 17 Drawing Sheets

OTHER PUBLICATIONS

"PS–1103 ADSL Central Office Line Filter Shelf: Quick Step Installation Instructions for PS–1103 Shelf", *Wilcom*, 2 pages (Jun. 2000).

"PS–1103 CO POTS Splitter: High Density xDSL Central Office Splitter", *Wilcom*, 2 pages (Jul. 2000).

"PS–1103 CO POTS Splitter: High Density xDSL Central Office Splitter", *Wilcom*, 2 pages (Nov. 2000).

"BroadWire™ 240–Port 19–Inch or 600 MM ETSI Mounting High–Density Splitter Chassis Installation Guide", *ADC Telecommunications, Inc.*, 14 pages (Oct. 2000).

"BroadWire™ 528–Port 23–Inch Central Office ADSL Splitter Chassis Installation Guide", *ADC Telecommunications, Inc.*, 17 pages (Aug. 2000).

* cited by examiner

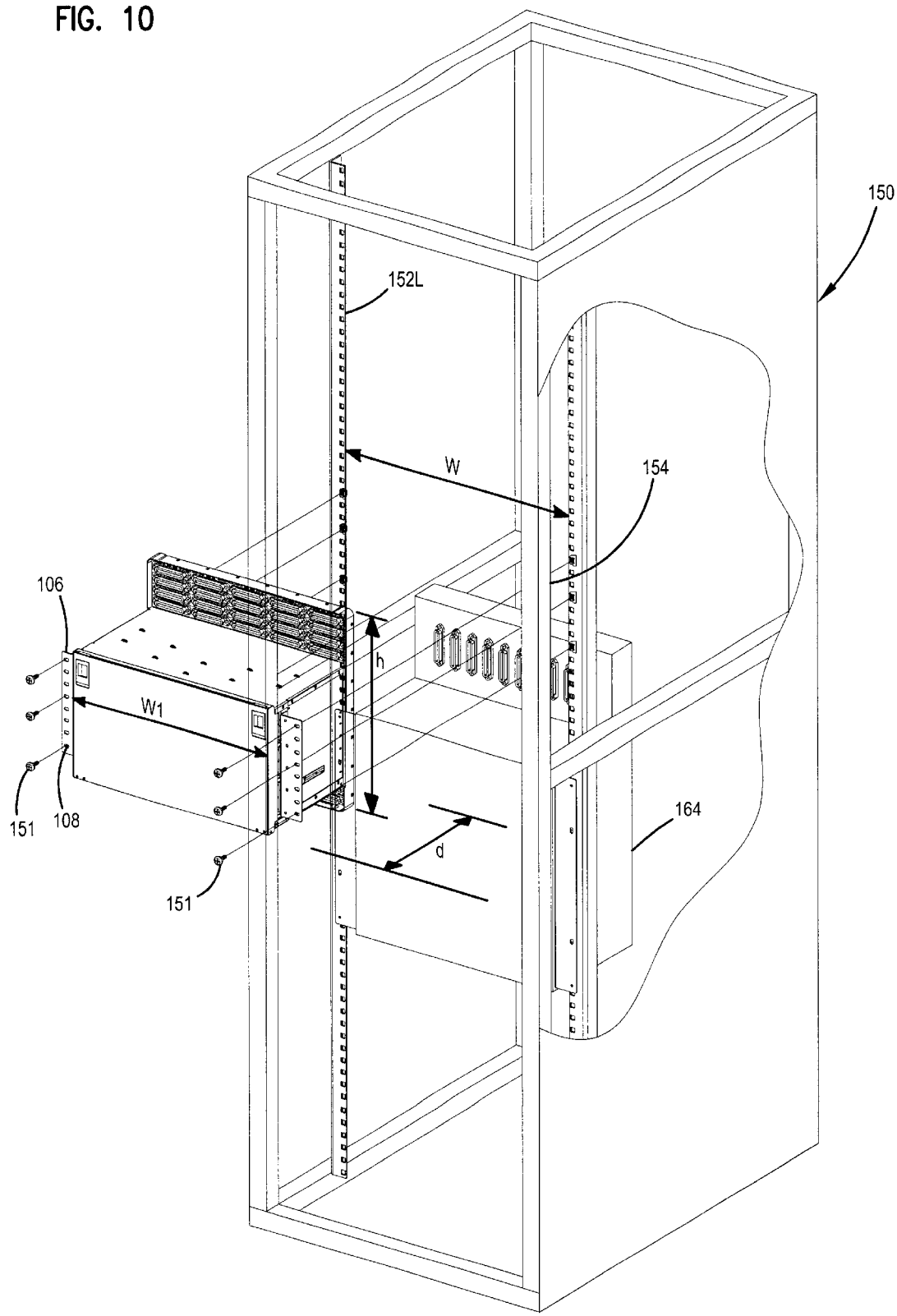

SPLITTER ASSEMBLY WITH HIGH DENSITY BACKPLANE BOARD

FIELD OF THE INVENTION

The present invention relates generally to telecommunications devices. More particularly, the present invention relates to telecommunications devices for splitting telecommunications signals.

BACKGROUND OF THE INVENTION

Most telecommunications systems include cables (e.g., fiber optic cables or copper twisted pair cables) for interconnecting pieces of telecommunications equipment. For example, in a typical telephone carrier system servicing residences and/or businesses, cables are used to couple components such as an MDF (main distribution frame), a POTS (plain old telephone service) splitter for separating voice and data signals and a DSLAM (digital subscriber line access multiplexer). A telephone carrier's central office frequently includes multiple rows of telecommunications racks or cabinets. Each rack or cabinet is sized to hold several different pieces of telecommunications equipment. Racks typically have open fronts and open backs for allowing both front and back access to equipment, while cabinets typically have closed backs such that equipment is only accessible from the front. Often thousands of cables are used to interconnect the various pieces of telecommunications equipment mounted on the racks or cabinets.

Circuit density is an important consideration relevant to the design of telecommunications equipment. Circuit density relates to the number of telecommunications lines that can be routed through a given volume of rack/cabinet space. By increasing the circuit density at a given location such as a telephone carrier central office, the overall capacity of the location can be increased.

POTS splitters are an excellent example of a type of telecommunications equipment where relatively high circuit densities are desirable. An exemplary POTS splitter system includes a plurality of splitter devices mounted within a splitter chassis. To improve the circuit density of the POTS splitter system, the splitter devices can be mounted on circuit boards that fit within the splitter chassis. It is desirable for the circuit boards to be easily inserted into and removed from the splitter chassis. It is also desirable for connectors associated with the splitter system to be readily accessible.

Other considerations relevant to the design of telecommunications equipment include cable management, manufacturing cost, assembly time, reliability and weight.

SUMMARY OF THE INVENTION

One aspect of the present invention relates to a telecommunications device including a plurality of splitter cards mounted in a chassis. The device also includes a circuit board and plurality of card edge connectors for providing electrical connections between the splitter cards and the circuit board. The device further includes POTS connectors, LINE connectors and DATA connectors. The circuit board includes a first layer having first tracings that electrically connect contacts of at least one of the POTS, LINE or DATA connectors to at least one of the card edge connectors; a second layer having second tracings that electrically connect contacts of at least one of the POTS, LINE or DATA connectors to at least one of the card edge connectors; and a third layer having third tracings that electrically connect contacts of at least one of the POTS, LINE or DATA connectors to at least one of the card edge connectors. The second layer is positioned between the first and third layers. A majority of the second layer is covered by a grounding plane. The grounding plane and the second tracings are co-planar such that the grounding plane adds no additional thickness to the second layer. The grounding plane is positioned between the first and third tracings to reduce crosstalk between the first and third tracings.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

FIG. 10 is a perspective view of the splitter assembly of FIG. 3 in the process of being mounted in a cabinet;

Figure 1:
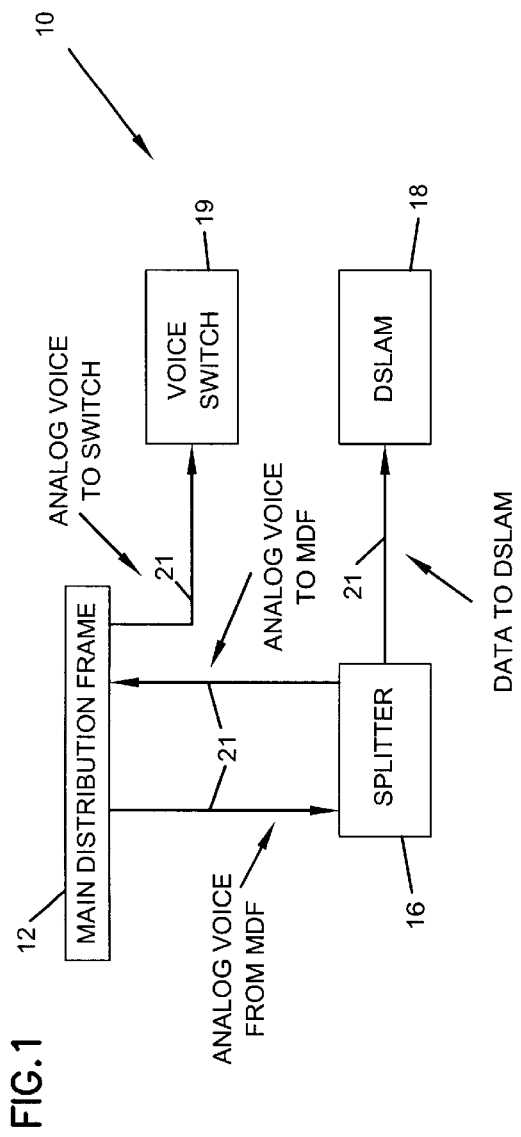
FIG. 1 is a diagram of a telecommunications system including an MDF, a splitter device, a DSLAM, and a voice switch.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION

In the following detailed description, references are made to the accompanying drawings that depict various embodiments in which the invention may be practiced. It is to be understood that other embodiments may be utilized, and structural and functional changes may be made without departing from the scope of the present invention.

I. General Telecommunications System Description

Referring now to FIG. 1, a telecommunications system 10 is shown. The system 10 is representative of a telephone carrier's system for transmitting voice and data to residences and businesses. A main distribution frame (MDF) 12 is linked to a splitter device 16 (e.g., a card including POTS splitter circuits or ISDN splitter circuits). The MDF 12 is also linked to one or more DSLAM modules 18, and a voice switch 19 (e.g., a switch equipped with POTS interface line cards or ISDN interface line cards).

In use of the system 10, the splitter device 16 receives a mixed voice and data signal from the MDF 12. The splitter device 16 splits the mixed signal into split signals, and then filters the split signals. For example, one of the split signals can be filtered to provide a voice only signal (i.e., the high frequency data portion of the signal is filtered out), while the other split signal can be filtered to provide a data only signal (i.e., the low frequency voice portion of the signal is filtered out). The data only signals are passed from the splitter device 16 to the DSLAM 18. The voice only signals are passed from the splitter device 16 to the MDF 12 for transmission to the voice switch 19.

Figure 2:
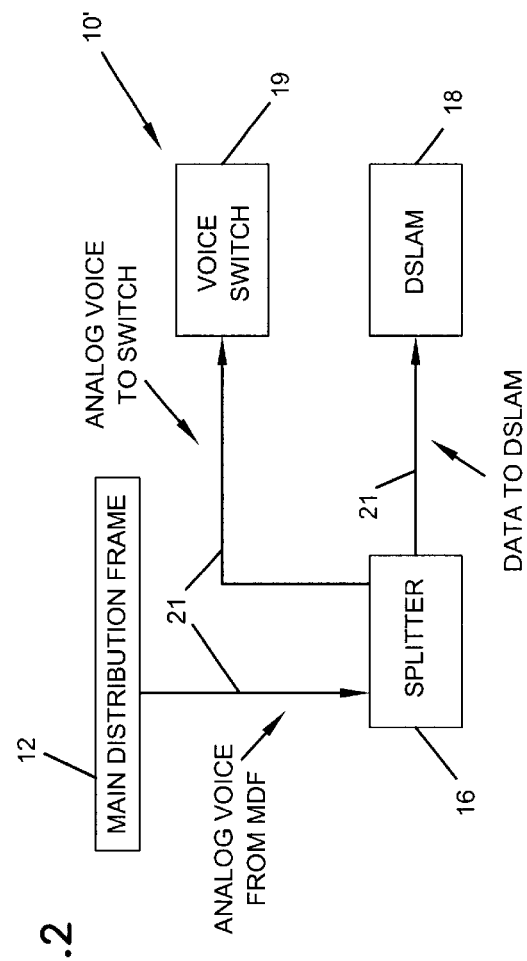
FIG. 2 is another telecommunications system including an MDF, a splitter device, a DSLAM, and a voice switch.

FIG. 2 shows a similar telecommunications system 10' having the same components as those described with respect to the telecommunications system 10 of FIG. 1. However, in the embodiment of FIG. 2, voice signals are transmitted directly from the splitter device 16 to the voice switch 19.

Referring still to FIGS. 1 and 2, the MDF 12, the POTS splitter device 16, the DSLAM 18 and the voice switch 19 are typically interconnected by cables 21. The cables 21 preferably each include multiple pairs of conductors for transmitting separate twisted pair signals. By way of example, the cables 21 can comprise 25 pair cables (i.e., cables each containing 25 pairs of wire conductors). Multi-pair connectors are used to provide interconnections between the cables 21 and the components of the telecommunications system 10. For example, multi-pair connectors are typically provided at the ends of the cables 21. The multi-pair connectors at the ends of the cables 21 are commonly coupled to corresponding multi-pair cable connectors mounted at the equipment to provide connections thereinbetween.

Exemplary multi-pair cable connectors suitable for use with telecommunications equipment as described above are sold by AMP of Harrisburg, Pa., a division of Tyco Electronics; or Kycon, Inc. of San Jose Calif. Connectors suitable for use with 25 pair cable typically include 25 pairs of contacts (i.e., 50 pins). This type of connector can be referred to as an "RJ-21X" connector or a "telco" connector. Often, 24 pairs of the contacts are available for transmitting signals, while one pair is grounded. Straight connectors and right-angle connectors are commonly used.

It will be appreciated that the various aspects of the present invention are applicable to a variety of telecommunications service options including, among other things, ADSL (Asymmetric Digital Subscriber Line), IDSL (Integrated Services Digital Network DSL), SDSL (Symmetric DSL) and VDSL (very high speed DSL) services.

II. Splitter Chassis Assembly

Figure 3:
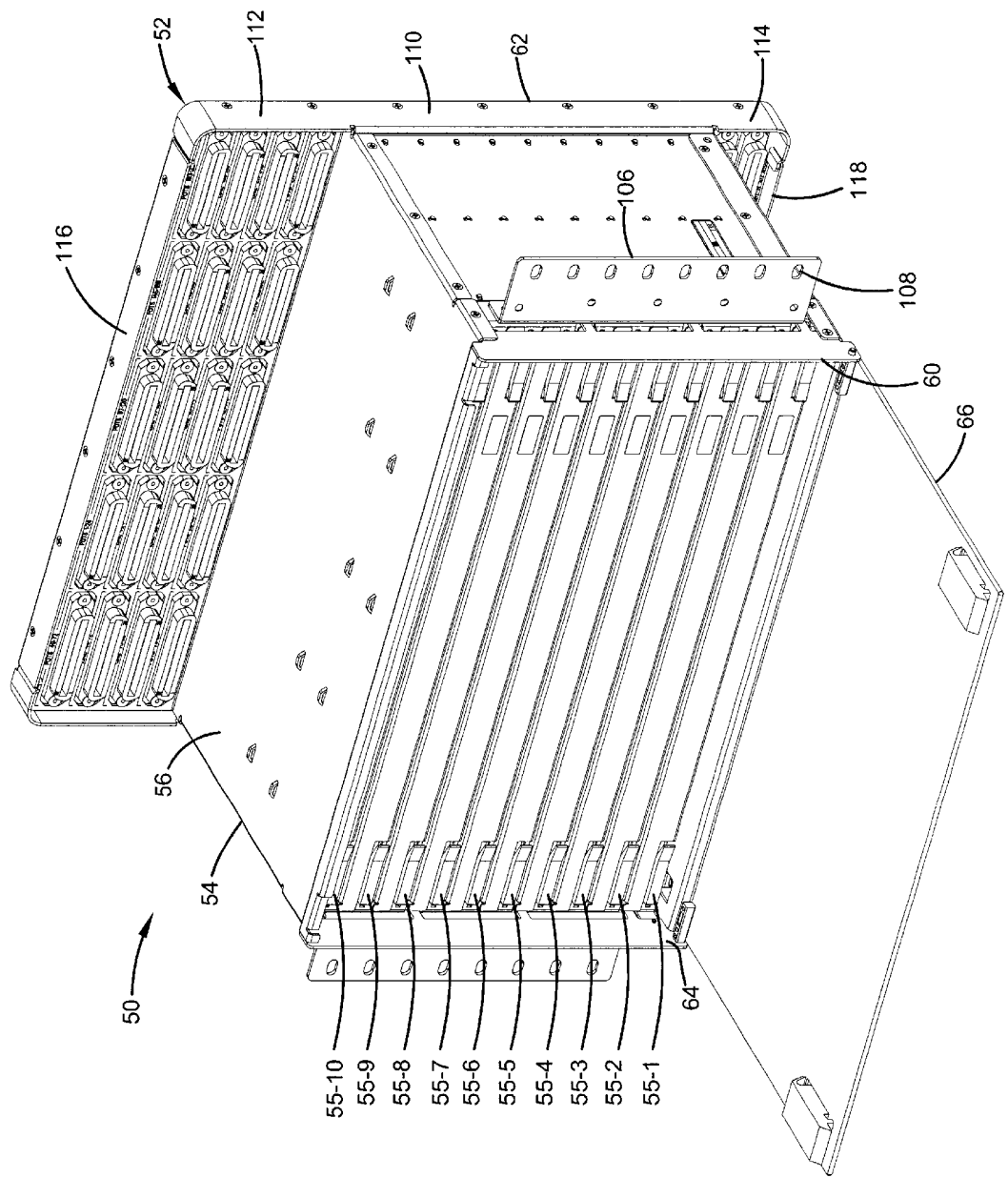
FIG. 3 is a perspective view of a splitter assembly constructed in accordance with the principles of the present invention, the splitter assembly includes a chassis that is shown fully loaded with splitter cards.

FIG. 3 illustrates a splitter assembly 50 constructed in accordance with the principles of the present invention. The splitter assembly 50 includes a chassis 52 defining a generally rectangular card housing 54. The card housing 54 includes a top wall 56 positioned opposite from a bottom wall 58 (best shown in FIG. 4), and a front end 60 positioned opposite from a back end 62. A plurality of splitter cards 55-1 to 55-10 are shown mounted within the card housing 54. The front end 60 of the card housing 54 defines an access opening 64 for allowing the splitter cards 55-1 to 55-10 to be inserted into or removed from the card housing 54. The access opening 64 can be opened and closed by a pivotal front door 66.

Figure 4:
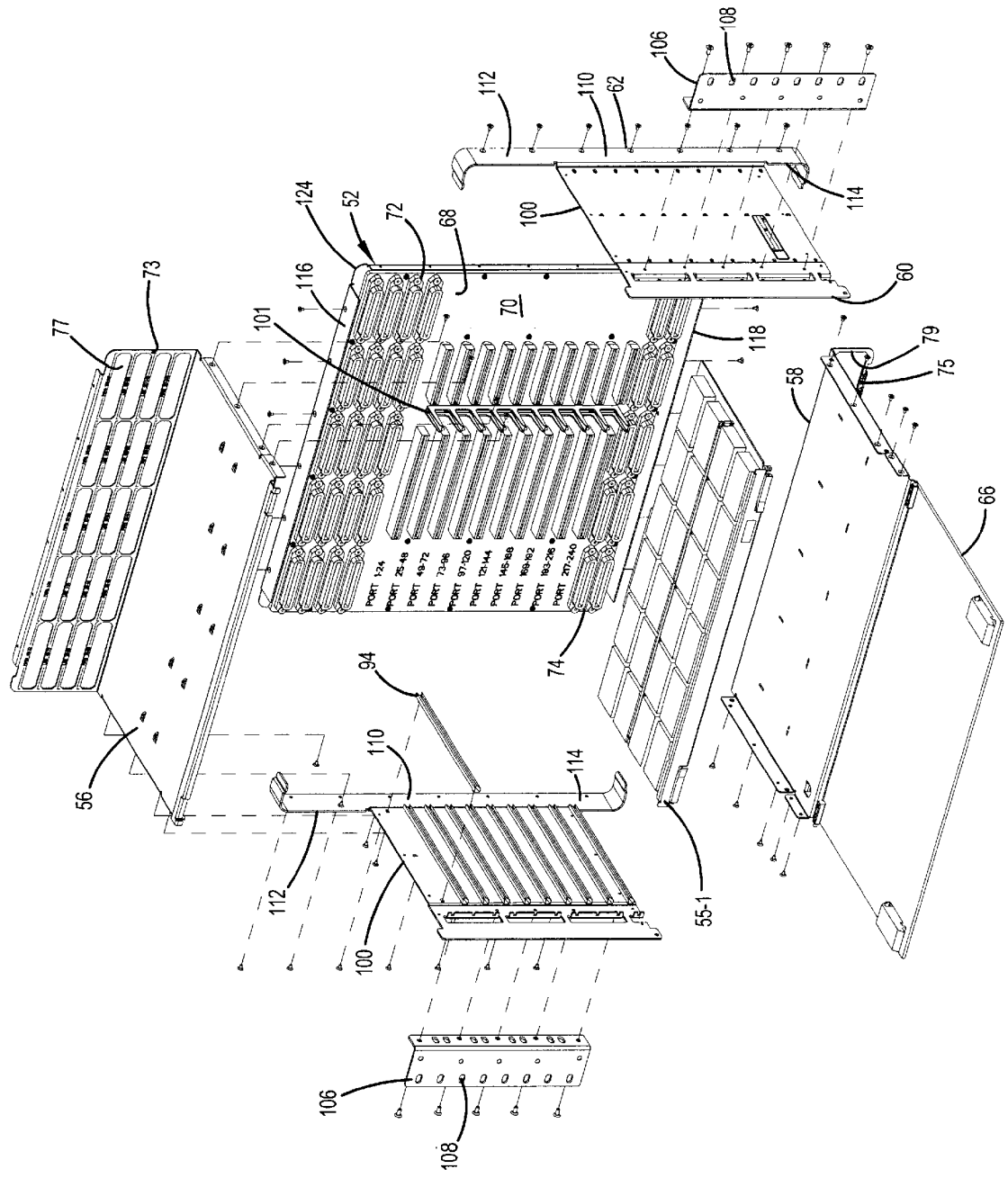
FIG. 4 is an exploded view of the splitter assembly of FIG. 3.

Referring to FIG. 4, the chassis 52 of the splitter assembly 50 includes two opposing side wall structures 100 for enclosing the left and right sides of the chassis 52. Mounting flanges 106 are connected to the side wall structures 100 adjacent the front end 60 of the card housing 54. The mounting flanges 106 are adapted for allowing the splitter assembly 50 to be fastened (e.g., by screws or bolts) to a conventional rack or cabinet 150 (see FIG. 10). The flanges 106 define fastener openings 108 adapted to align with corresponding openings 154 defined by the cabinet 150. To secure the splitter assembly 50 to the cabinet 150, fasteners 151 are mounted through the aligned openings 108 and 154.

Referring again to FIG. 4, each side wall structure 100 also includes a rear reinforcement member 110 positioned adjacent the back end 62 of the card housing 54. The rear reinforcement members 110 include upper and lower extensions 112 and 114. Top and bottom support members 116 and 118 cooperate with the rear reinforcement members 110 to form a reinforcing frame. The reinforcing frame extends about the perimeter of a circuit board 68 located at a back plane of the splitter assembly (i.e., a back plane circuit board).

Figure 5:
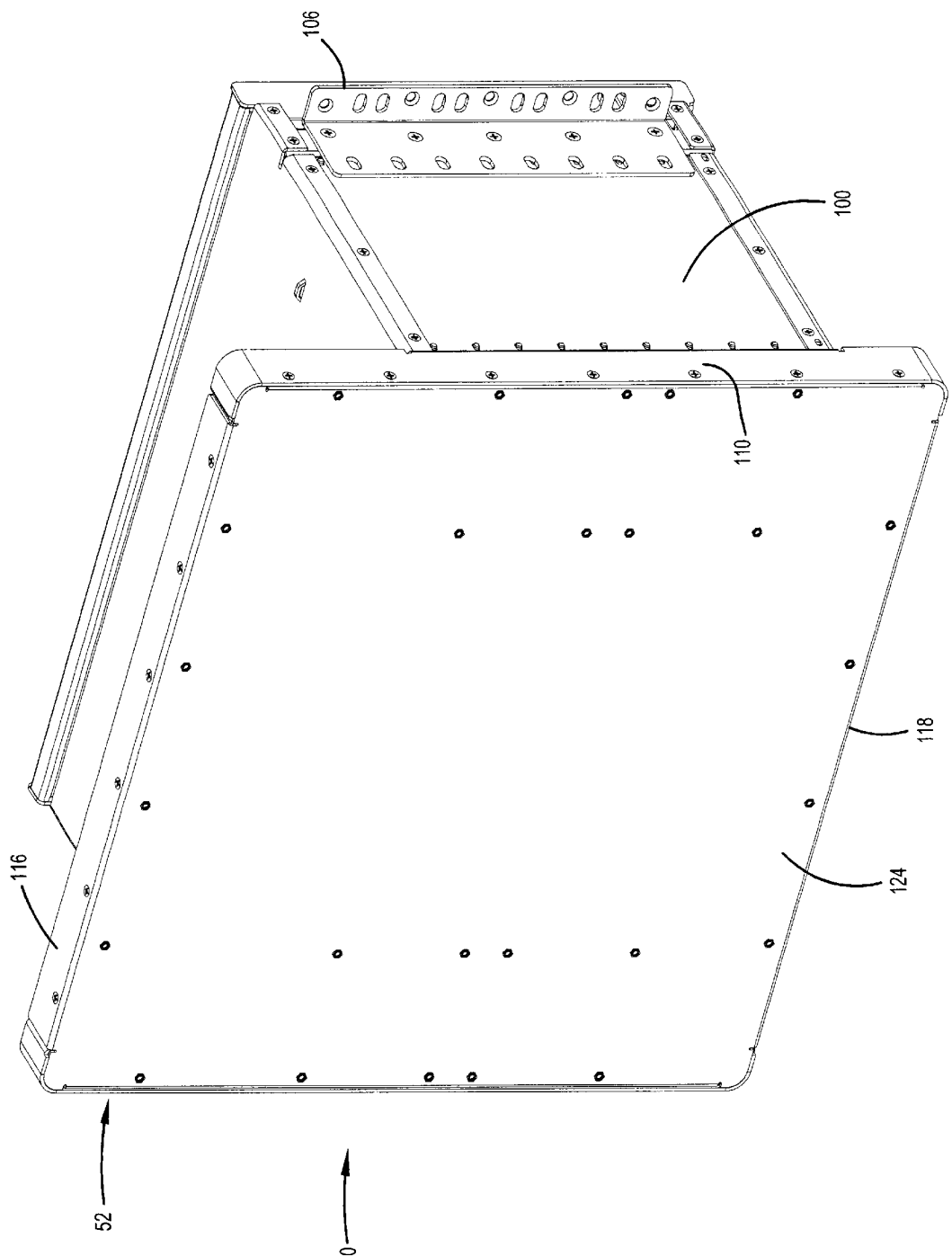
FIG. 5 is a rear perspective view of the splitter assembly of FIG. 3.

Referring to FIG. 5, the back of the chassis 52 is enclosed by a back plate 124 that is substantially the same size as the back plane circuit board 68. As shown in FIGS. 4 and 5, the top and bottom support members 116 and 118 are integrally connected with the back plate 124. The back plate 124 is fastened to the side walls 100 and top and bottom face plates 73 and 75 of the chassis 52 by conventional fasteners.

Referring again to FIG. 4, the printed circuit board 68 is mounted at the back end 62 of the card housing 54. The printed circuit board 68 includes a front face 70 (i.e., a front side) that faces toward the front end 60 of the card housing 54. The printed circuit board 68 includes an upper portion 72 covered by the upper face plate 73 and a lower portion 74 covered by lower face plate 75. The upper portion 72 of the circuit board 68 extends higher than the top wall 56 of the card housing 54. The lower portion 74 of the printed circuit board 68 extends lower than the bottom wall 58 of the card housing 54. The upper and lower face plates 73 and 75 are respectively integrally connected with the top and bottom walls 56 and 58 of the housing 54.

Figure 6:
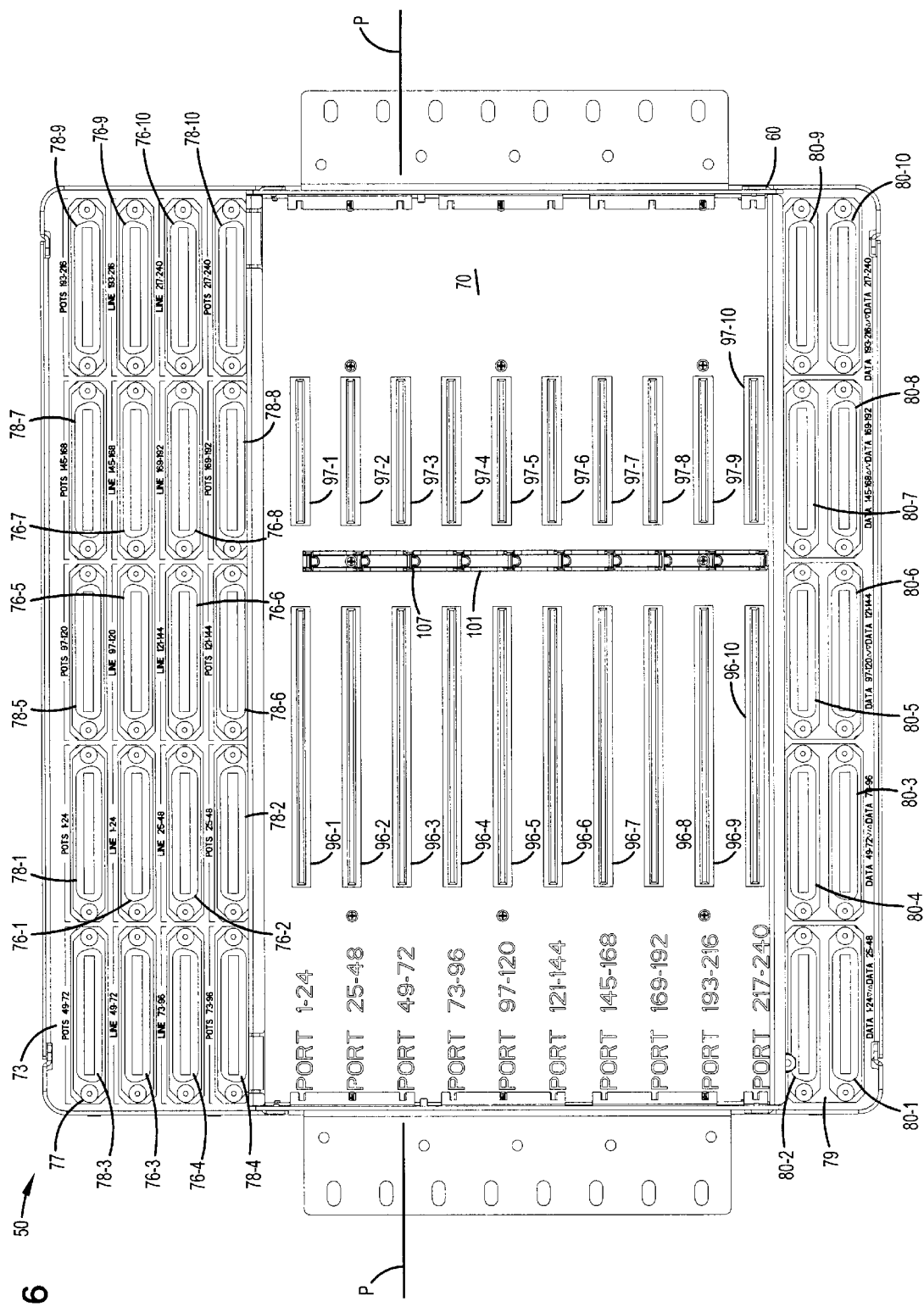
FIG. 6 is a front view of the splitter assembly of FIG. 3 with the splitter cards and the front door removed.

Referring now to FIG. 6, a plurality of LINE connectors 76-1 to 76-10 are mechanically coupled to the front face 70 of the circuit board 68 at the upper portion 72. Also, a plurality of POTS connectors 78-1 to 78-10 are mechanically coupled to the front face 70 of the upper portion 72 of the circuit board 68. The LINE and POTS connectors are preferably mechanically coupled directly to the circuit board 68 (e.g., by fasteners such as screws or bolts) and are mounted to extend through rectangular openings 77 (shown in FIG. 4) defined by the upper face plate 73. It will be appreciated that the LINE connectors 76-1 to 76-10 are used to input composite signals (i.e., signals having both data and voice) to the splitter assembly 50, and the POTS connectors 78-1 to 78-10 are used to output voice-only signals from the splitter assembly 50.

The LINE connectors 76-1 to 76-10 and the POTS connectors 78-1 to 78-10 of the splitter assembly 50 are preferably each positioned in a generally horizontal orientation (i.e., the length of each connector preferably extends in a horizontal or substantially horizontal direction). Also, the LINE connectors 76-1 to 76-10 and the POTS connectors 78-1 to 78-10 collectively are arranged to form a generally rectangular array. Preferably, the array includes five vertical rows each including four vertically spaced-apart connectors, and four horizontal rows each including five connectors. Preferably, each vertical row includes two horizontally oriented LINE connectors and two horizontally oriented POTS connectors. For example, the middle vertical row of the array is shown including POTS connectors 78-5 and 78-6 at the uppermost and lowermost positions, and LINE connectors 76-5 and 76-6 located at intermediate positions between the POTS connectors 78-5 and 78-6. The other vertical rows are preferably arranged in a similar configuration with POTS connectors located at the uppermost and lowermost positions, and corresponding LINE connectors being located between the POTS connectors.

As shown in FIG. 6, selected connectors of each vertical row are preferably inverted in orientation (i.e., rotated about 180 degrees in orientation) relative to one another. For example, as shown in the middle vertical row, the POTS connectors 78-5 and 78-6 are oriented up-side-down as compared to the LINE connectors 76-1 and 76-2. More specifically, the LINE connectors 76-5 and 76-6 are oriented with the wider portions of the connectors facing upwardly and the more narrow portions of the connectors facing downwardly. In contrast, the POTS connectors 78-5 and 78-6 are oriented with the wider portions of the connectors facing downwardly and the more narrow portions of the connectors facing upwardly. As labeled in FIG. 12, the wider portions of the connectors correspond to pins 1–25 and the more narrow portions correspond to pins 26–50. It will be appreciated that the connectors of the other vertical rows are preferably inverted in a similar manner. As will be described later in the specification, the inverted configuration of the connectors assists in reducing the amount of crossing that occurs between tracings of the back plane board 68. This promotes manufacturing efficiency by allowing the number of layers used by the board 68 to be reduced.

Figure 12:
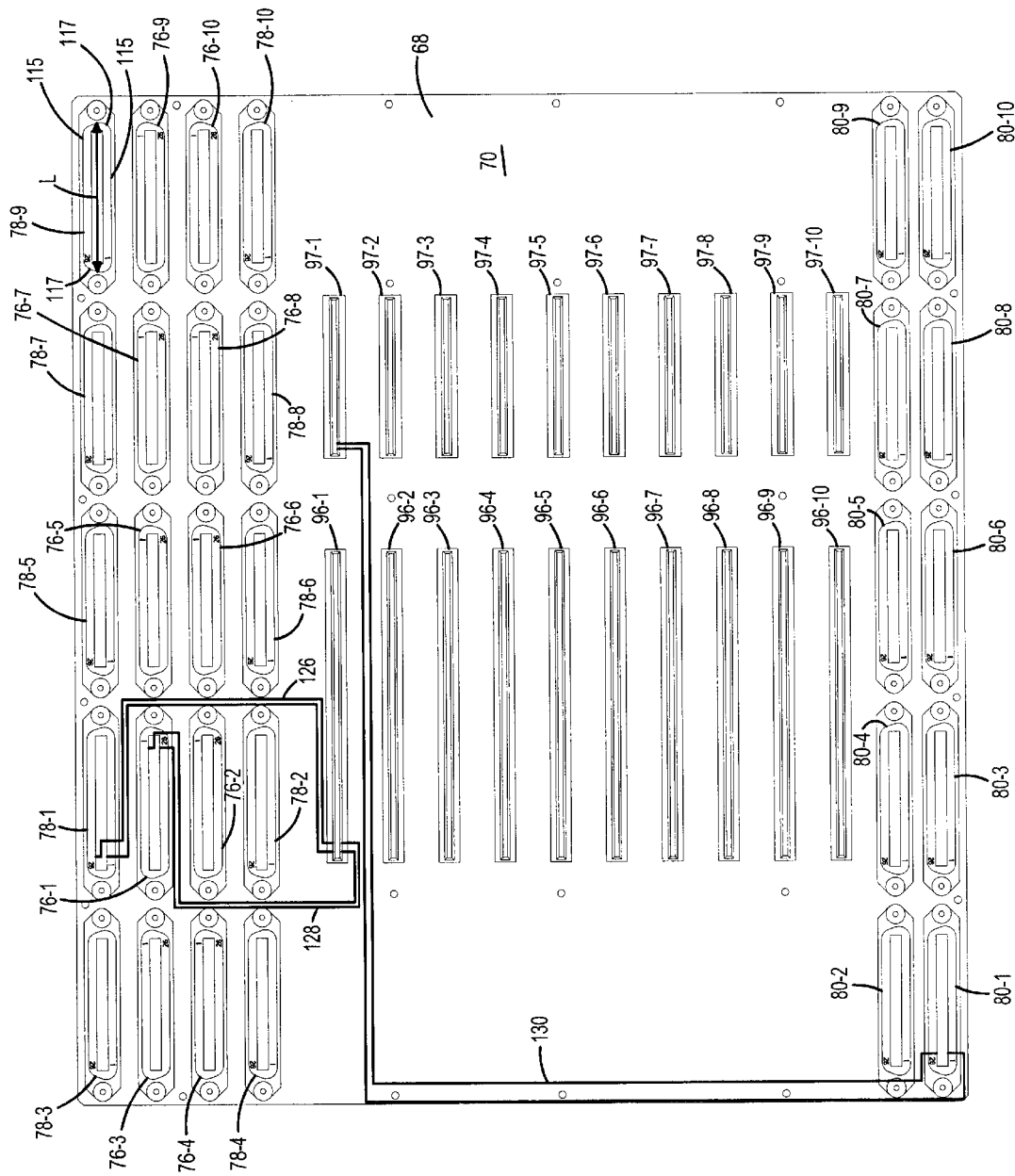
FIG. 12 is a plan view of an exemplary tracing layout for one circuit of the back plane circuit board of the splitter assembly of FIG. 3.

Referring to FIG. 12, the POTS and LINE connectors 78-1 to 78-10 and 76-1 to 76-10 each preferably have elongated sides 115 and relatively narrow ends 117. The elongated sides of 115 are parallel to lengths L of the connectors 78-1 to 78-10 and 76-1 to 76-10. Preferably, the inverted connectors and the right-side-up connectors are positioned with the elongated sides opposing one another. Additionally, while the inverted and right-side-up connectors are shown in a horizontal orientation with a vertical space between the connectors, the connectors could also be oriented in a vertical orientation with a horizontal space between the connectors.

The splitter assembly 50 also includes a plurality of DATA connectors 80-1 to 80-10 (see FIG. 6). The DATA connectors 80-1 to 80-10 are preferably directly mechanically coupled (e.g., by fasteners) to the front face of the lower portion 74 of the circuit board 68. As best shown in FIG. 4, the DATA connectors 80-1 to 80-10 extend through generally rectangular openings 79 defined by the lower face plate 75. Each of the DATA connectors 80-1 to 80-10 is arranged in a generally horizontal orientation (i.e., the lengths of the connectors extend in a generally horizontal direction). As shown in FIG. 6, the DATA connectors 80-1 to 80-10 collectively define a generally rectangular array. Preferably, the array includes five vertical rows each including two vertically spaced-apart connectors, and two horizontal rows each including five connectors. It will be appreciated that the DATA connectors 80-1 to 80-10 are used to output DATA signals from the splitter assembly 50.

The LINE, POTS and DATA connectors are preferably conventional multi-pin telecommunications connectors such as 50 pin telecommunications connectors for use with 25 pair cable. Also, the phrase "mechanically coupled" is intended to include situations where the connectors are fastened or mounted directly to the circuit board 68 as well as situations in which one or more intermediate members are provided between the connectors and the circuit board 68.

Referring again to FIG. 6, the splitter assembly 50 further includes first card edge connectors 96-1 to 96-10 and second card edge connectors 97-1 to 97-10 which are connected to the front face of the back plane circuit board 68. The card edge connectors 96-1 to 96-10 and 97-1 to 97-10 are preferably horizontally oriented (i.e., the lengths of the connectors 96-1 to 96-10 and 97-1 to 97-10 extend in a generally horizontal orientation). The first card edge connectors 96-1 to 96-10 collectively define a generally vertical first row and the second card edge connectors 97-1 to 97-10 collectively define a generally vertical second row. As will be described in greater detail later in the specification, the card edge connectors 96-1 to 96-10 and 97-1 to 97-10 function provide an electrical interface between the back plane circuit board 68 and each splitter card 55-1 to 55-10 of the assembly 50. The circuit board 68 preferably electrically connects the first card edge connectors 96-1 to 96-10 to the LINE and POTS connectors 76-1 to 76-10 and 78-1 to 78-10. Also, the circuit board 68 preferably electrically connects the second card edge connectors 97-1 to 97-10 to the DATA connectors 80-1 to 80-10.

III. Splitter Cards

Figure 7:
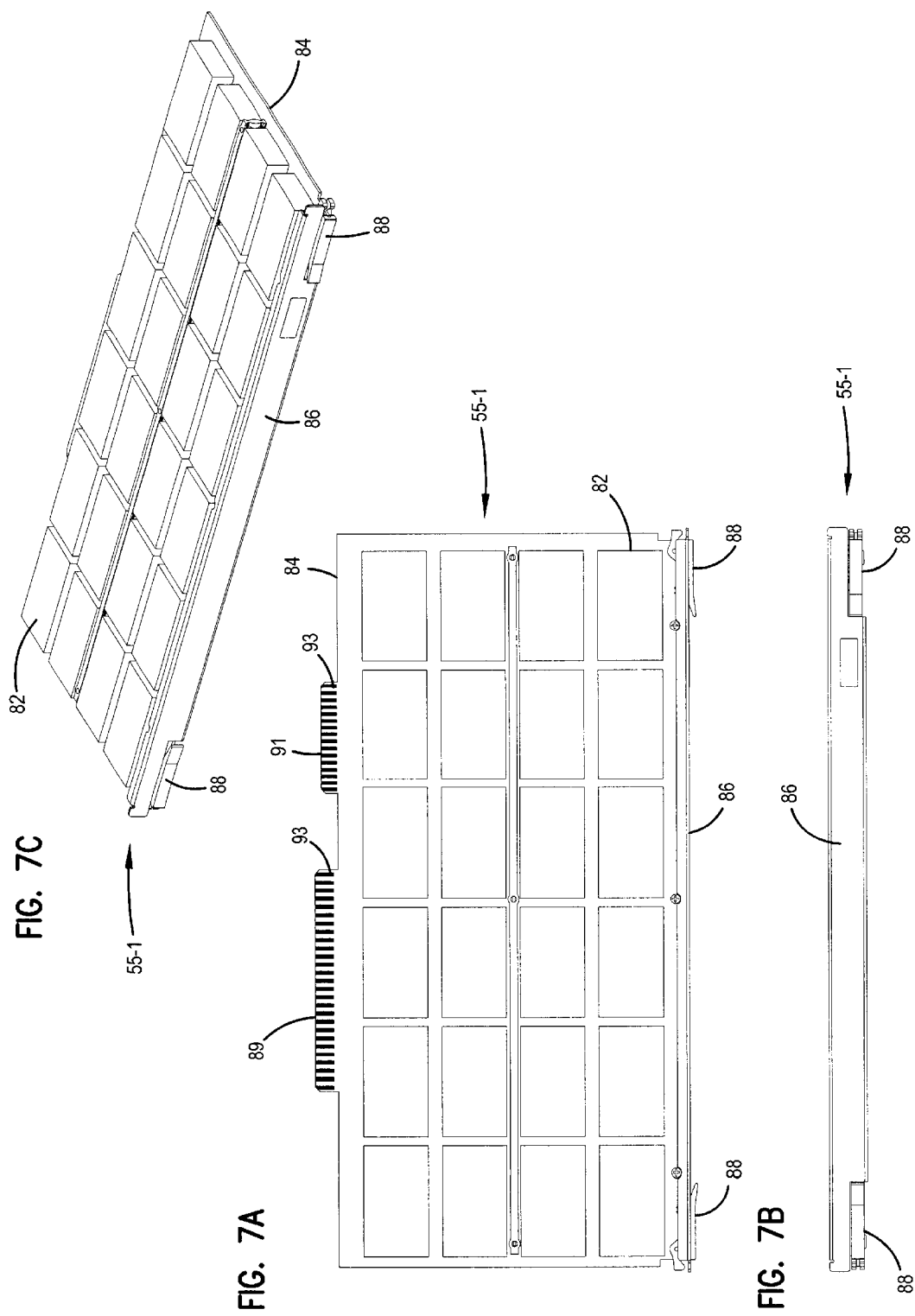
FIG. 7A is a plan view of one of the splitter cards of the splitter assembly of FIG. 3.
FIG. 7B is a front view of the splitter card of FIG. 7A.
FIG. 7C is a front perspective view of the splitter card of FIG. 7A.

Referring now to FIGS. 7A–7C, one of the splitter cards 55-1 of the splitter assembly 50 is shown in isolation from the card housing 54. The depicted splitter card 55-1 includes a plurality of splitters 82 (e.g., 24 splitters) mounted on a circuit board 84. The card 55-1 also includes a front face plate 86 mounted to a front edge of the circuit board 84. Retaining latches 88 are located at left and right edges of the face plate 86 for retaining the splitter card 55-1 within the card housing 54. The card 55-1 also preferably includes first and second card edge extensions 89 and 91 (i.e., card edge connectors) located adjacent a rear edge of the circuit board 84. Preferably, electrical contacts/pads 93 are located on both the top and bottom sides of the card edge extensions 89 and 91. Tracings (not shown) on the circuit board 84 electrically connect the pads 93 to the splitters 82. When the card 55-1 is fully inserted in the card housing 54, the extensions 89 and 91 are respectively received in the first and second card edge connectors 96-1 and 97-1 to provide an electrical interface between the splitter card 55-1 and the back plane circuit board 68. It will be appreciated that the depicted splitter card 55-1 is representative of the other splitter cards 55-2 to 55-10.

The splitters 82 of the splitter assembly 50 can have a number of different configurations. For example, the splitters 82 can include conventional POTS splitter circuits. A conventional POTS splitter circuit functions to split a composite signal (i.e., a mixed voice/data signal) into two composite signals. One of the split composite signals is typically passed through one or more low pass filters capable of passing the relatively lower frequency voice content of the composite signal (e.g., less than about 4 kilohertz) and rejecting the composite signal content above the voice band (e.g., 30 kilohertz and above). The other split composite signal can be passed through a high pass filter that passes the composite signal content associated with the data band (e.g., about 30 kilohertz and above), and rejects the relatively lower frequency voice content of the composite signal. Alternatively, the other split signal can be unfiltered such that the signal remains a composite signal. For such an embodiment, it is assumed that the DSLAM or other digital multi-plexer that ultimately receives the composite signal will provide any required high-pass filter elements to remove the relatively low frequency voice signal content of the composite signal. It will further be appreciated that ISDN (Integrated Services Digital Network) filter circuits could also be used.

IV. Card Insertion Process with Structure for Card Guidance

Figure 8:
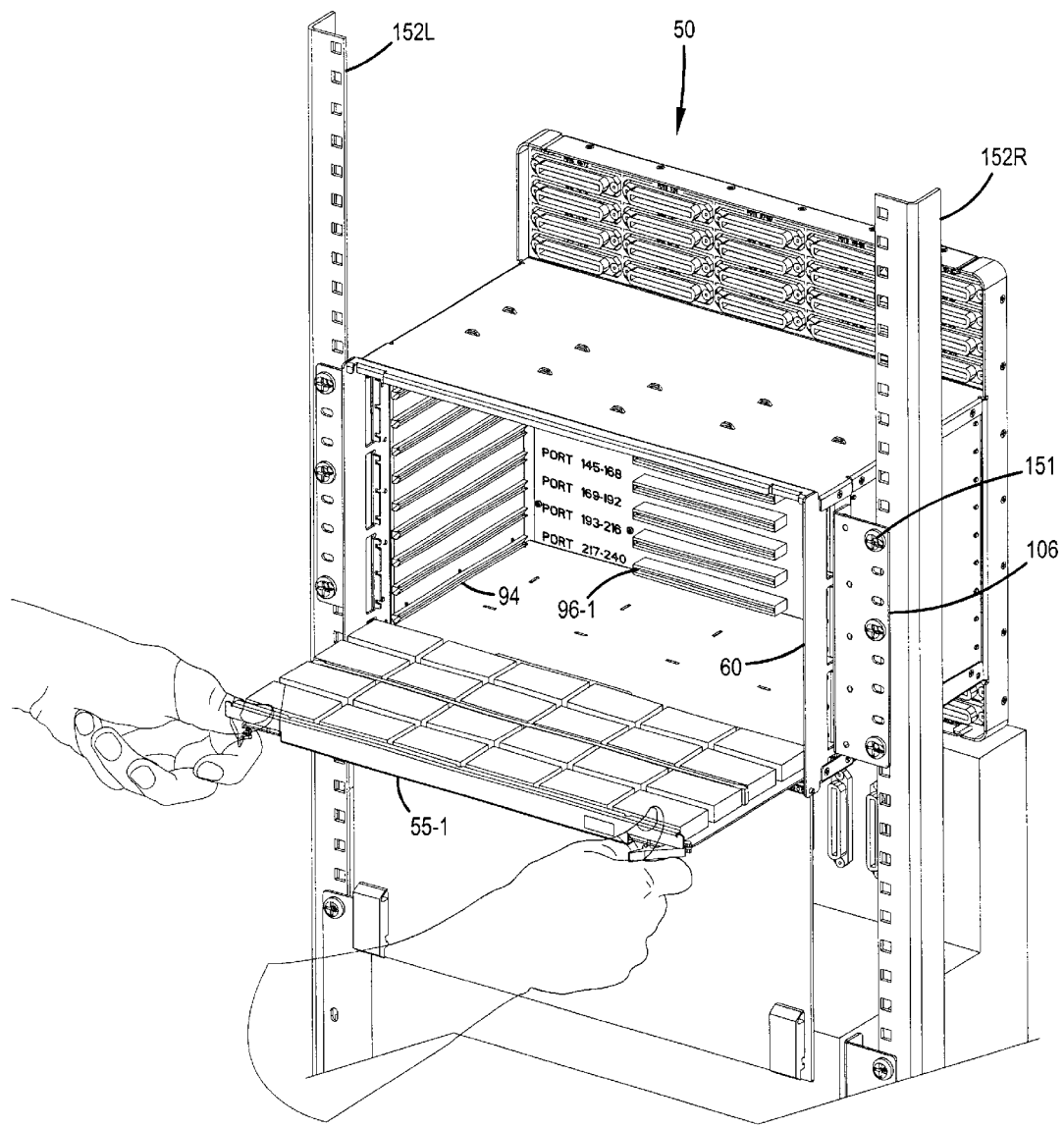
FIG. 8 is a perspective of the splitter assembly of FIG. 3 with a splitter card being inserted within the chassis.

Referring to FIG. 8, the splitter cards 55-1 to 55-10 are mounted within the card housing by sliding the cards through the front end 60 of the card housing 54. Opposing left and right tracks 94 (only the left tracks 94 are shown in FIG. 9) receive left and right edges of the splitter card circuit boards 84 to guide the splitter cards 55-1 to 55-10 into the card housing 54. When fully inserted within the housing 54, the first and second card extensions 89 and 91 of the splitter cards 55-1 to 55-10 are respectively received within the first and second card edge connectors 96-1 to 96-10 and 97-1 to 97-10 of the back plane board 68. Upon insertion, the contact pads 93 of the extensions 89 and 91 engage corresponding contacts within the card edge connectors 96-1 to 96-10 to provide an electrical connection between the components. When mounted within the housing 54, the circuit boards 84 of the splitter cards 55-1 to 55-10 are each positioned in a generally horizontal orientation.

Figure 9C:
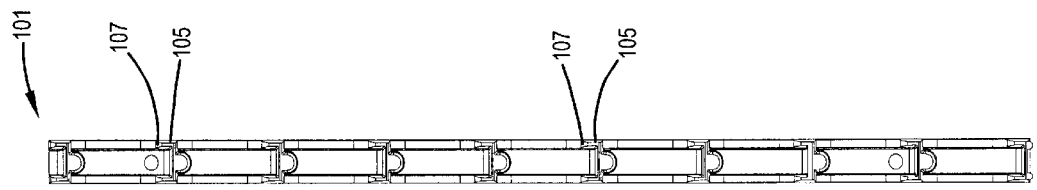
FIG. 9C is a front view of the rear card guide of FIG. 9A.
Figure 9B:
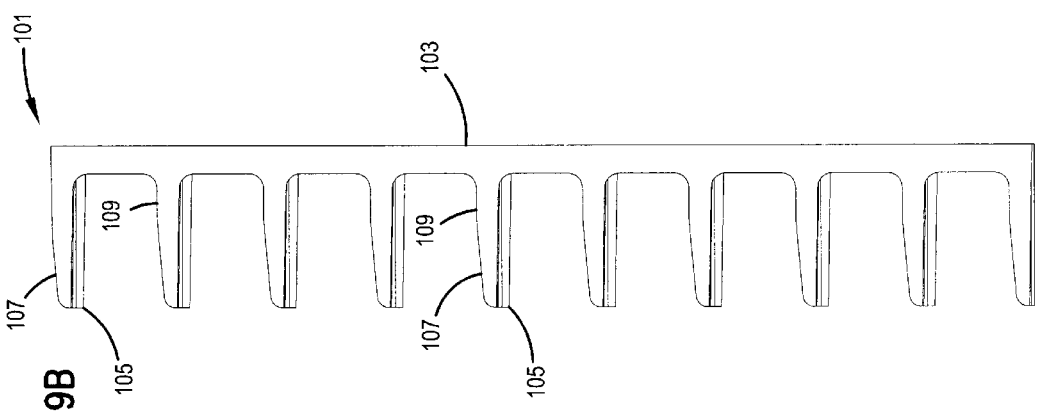
FIG. 9B is a side view of the rear card guide of FIG. 9A.
Figure 9A:
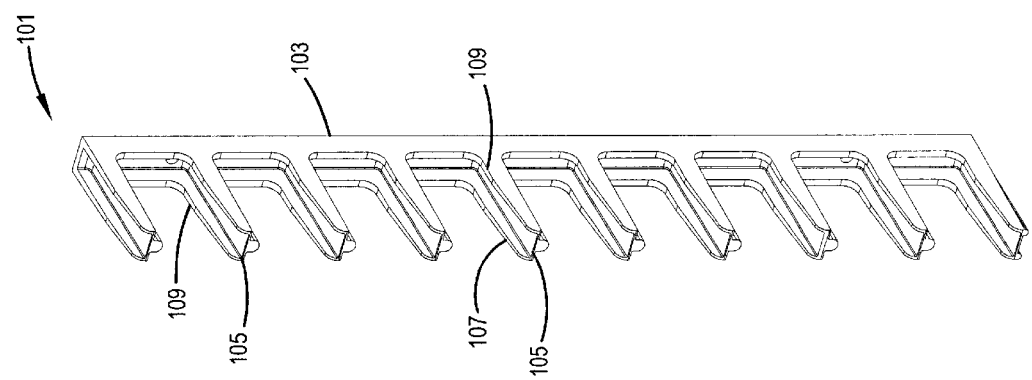
FIG. 9A is a perspective view of a rear card guide of the splitter assembly of FIG. 3.

During the card insertion process, the splitter cards 55-1 to 55-10 have a tendency to bow or sag downwardly due to the weight of the splitters 82 and the relatively large distance traversed between the left and right tracks 94. This sagging makes it difficult to insert the first and second card edge extensions 89 and 91 into their respective card edge connectors 96-1 to 96-10 and 97-1 to 97-10. To overcome this problem, a card guide 101 (shown in FIGS. 4 and 6) is positioned adjacent the backplane of the splitter assembly. As shown in FIGS. 9A–9C, the card guide 101 includes a base 103 and a plurality of guide members 105 (e.g., ten guide members) that project forwardly from the base 103. Each guide member 105 includes an inclined ramp surface 107 and a horizontal top surface 109.

Referring to FIG. 6, the card guide 101 is connected to the back plane circuit board 68 by conventional techniques (e.g., fasteners such as screws or bolts). The card guide 101 is mounted in a generally vertical orientation. As so mounted, guide members 105 are positioned between corresponding card edge connectors 96-1 to 96-10 and 97-1 to 97-10. The inclined ramp surfaces 107 of the guide members 105 are inclined relative to the direction of insertion of the splitter cards 55-1 to 55-10 (i.e., the direction defined by tracks 94) so as to guide the rearward edges of the splitter cards 55-1 to 55-10 into their respective card edge connectors 96-1 to 96-10 and 97-1 to 97-10. The inclined ramp surfaces 107 are preferably located lower than their corresponding card edge connectors 96-1 to 96-10 and 97-1 to 97-10. As shown in FIG. 6, the top surfaces 109 of the guide members 105 preferably align generally with reference planes P that extend along bottom edges of card edge receiving openings defined by the card edge connectors 96-1 to 96-10 and 97-1 to 97-10.

V. Rack/Cabinet Mounting and Cable Management

As shown in FIGS. 3, 4 and 6, the LINE connectors 76-1 to 76-10, the POTS connectors 78-1 to 78-10 and the DATA connectors 80-1 to 80-10 all preferably face in a forward direction (i.e., toward the front end 60 of the card housing 54). This allows all of the connectors to be accessed from the front of the chassis 52. This type of arrangement is ideally suited for use with cabinets since cabinets often have closed back sides.

FIG. 10 shows the splitter assembly 50 in the process of being mounted within the telecommunications cabinet 150. The cabinet includes a bay in which the splitter assembly 50 is mounted. The bay is defined by left and right channel members 152L and 152R. The channel members 152L and 152R define the fastener openings 154. The splitter assembly 50 is mounted to the front side of the cabinet 150. For example, the mounting flanges 106 are fastened to the front sides of the channel members 152L and 152R by fasteners 151. The back of the cabinet 150 is closed. Thus, all of the connectors of the splitters assembly 50 are preferably accessible from the front.

Figure 11:
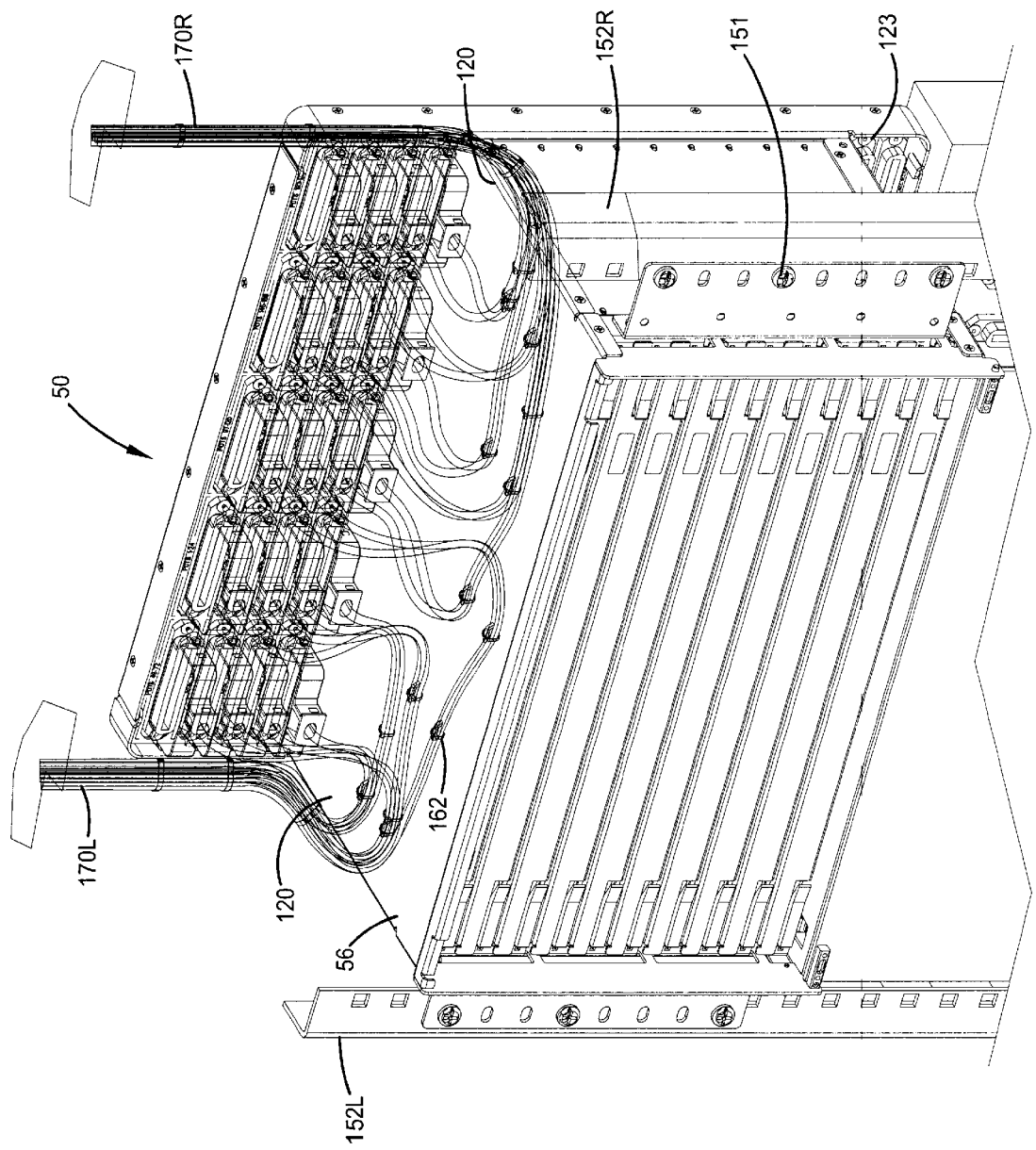
FIG. 11 shows an exemplary cable routing configuration for the splitter assembly of FIG. 3.

FIG. 11 shows preferred cable layout for cables connected to the LINE connectors 76-1 to 76-10 and the POTS connectors 78-1 to 78-10. As shown in FIG. 11, cables 170L corresponding to connectors 76-1 to 76-5 and 78-1 to 78-5 are routed laterally in a leftward direction through a left upper open side region 120 of the chassis 52. After passing through the left upper open side region 120, the cables 170L are routed vertically upwardly.

Cables 170R corresponding to the connectors 76-6 to 76-10 and 78-6 to 78-10 are routed laterally to the right side of the chassis 52. At the right side of the chassis 52, the cables 170R are passed through a right upper open side region 120 of the chassis 52. After passing through the open side region 120, the cables 170R are routed vertically upwardly.

Still referring to FIG. 11, the top surface of the top wall 56 includes structure for managing cables. For example, a plurality of lances 162 (i.e., tie-down loops) are provided on the top surface of the top wall 56. As shown in FIG. 11, the lances facilitate tying down groups of cable to the top wall 56.

The chassis 52 preferably also has open sides 123 located adjacent the data connectors 80-1 to 80-10. Thus, cables corresponding to the data connectors 80-1 to 80-10 can be routed laterally in the same manner depicted in FIG. 11 for the POTS and LINE connectors. Preferably, the splitter assembly 50 is mounted on the rack 150 at a position directly above a DSLAM 164 (shown in FIG. 10). Since the DATA connectors 80-1 to 80-10 are located at the bottom of the chassis 52, the DATA connectors are in close proximity to the DSLAM 164. This allows relatively short cables to be looped directly from the data connectors 80-1 to 80-10 to the DSLAM 164.

VI. Tracing Layout for Back Plane Circuit Board

FIG. 12 shows a front view of the back plane circuit board 68 in isolation from the chassis 52. The back plane circuit board 68 preferably includes tracings for electrically connecting the LINE connectors 76-1 to 76-10 and the POTS connectors 78-1 to 78-10 to the first card edge connectors 96-1 to 96-10. The back plane circuit board 68 also includes tracings for electrically connecting the DATA connectors 80-1 to 80-10 to the second card edge connectors 97-1 to 97-10. The splitter assembly 50 preferably includes 240 different circuits. In FIG. 12, a schematic tracing layout for one of the 240 circuits has been shown. The tracing layout includes POTS tracings 126 that electrically connect a pair of pins of the POTS connector 78-1 to a corresponding pair of contacts on the first card edge connector 96-1. The tracing layout also includes LINE tracings 128 that electrically connect a pair of pins of the LINE connector 76-1 to a corresponding pair of contacts of the first card edge connector 96-1. The tracing layout further includes data tracings 130 that electrically connect a pair of pins of the DATA connector 80-1 to a corresponding pair of contacts of the second card edge connector 97-1.

It will be appreciated that the LINE, POTS and DATA connectors are arranged in sets. For example, connectors 76-1, 78-1 and 80-1 form a first set, connectors 76-2, 78-2 and 80-2 form a second set, connectors 76-3, 78-3 and 80-3 form a third set, connectors 76-4, 78-4 and 80-4 form a fourth set, connectors 76-5, 78-5 and 80-5 form a fifth set, connectors 76-6, 78-6 and 80-6 form a sixth set, connectors 76-7, 78-7 and 80-7 form a seventh set, connectors 76-8, 78-8 and 80-8 form an eighth set, connectors 76-9, 78-9 and 80-9 form a ninth set and connectors 76-10, 78-10 and 80-10 form a tenth set.

Each set of connectors is adapted for handling 24 separate circuits (i.e., channels or lines). The circuits for the first set of connectors are routed through card edge connectors 96-1 and 97-1; the circuits for the second set of connectors are routed through card edge connectors 96-2 and 97-2; the circuits for the third set of connectors are routed through card edge connectors 96-3 and 97-3; the circuits for the fourth set of connectors are routed through card edge connectors 96-4 and 97-4; the circuits for the fifth set of connectors are routed through card edge connectors 96-5 and 97-5; the circuits for the sixth set of connectors are routed through card edge connectors 96-6 and 97-6; the circuits for the seventh set of connectors are routed through card edge connectors 96-7 and 97-7; the circuits for the eighth set of connectors are routed through card edge connectors 96-8 and 97-18; the circuits for the ninth set of connectors are routed through card edge connectors 96-9 and 97-9; and the circuits for the tenth set of connectors are routed through card edge connectors 96-10 and 97-10.

Referring to FIG. 12, the first card edge connectors 96-1 to 96-10 are arranged in a separate row from the second card edge connectors 97-1 to 97-10. The POTS and LINE connectors 78-1 to 78-10 and 76-1 to 76-10 are preferably electrically connected exclusively to the first card edge connectors 96-1 to 96-10 and the DATA connectors 80-1 to 80-10 are preferably connected exclusively to the second card edge connectors 97-1 to 97-10. This separation assists in simplifying the board 68 by reducing or eliminating the amount that tracings corresponding the to DATA connectors cross over tracing corresponding to the POTS and LINE connectors. However, other connector configurations can also be used and the connectors need not be segregated. For example, a single row of card edge connectors could be used with the POTS, LINE and DATA connectors all electrically connected to common card edge connectors.

Figure 13A:
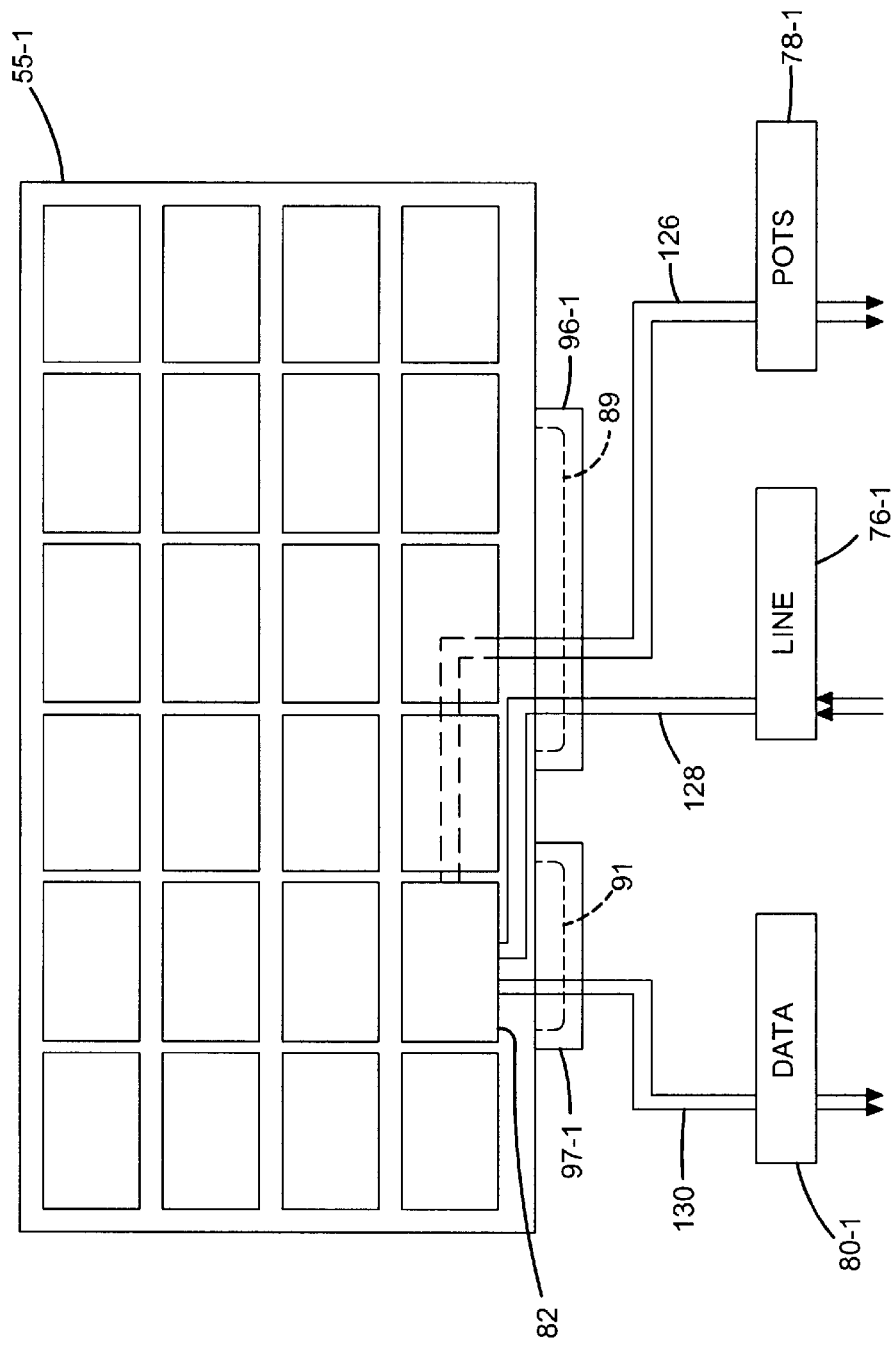
FIG. 13A is a schematic diagram of one circuit of the splitter assembly of FIG. 3 showing how a splitter card interfaces with the back plane of the splitter assembly.
Figure 13B:
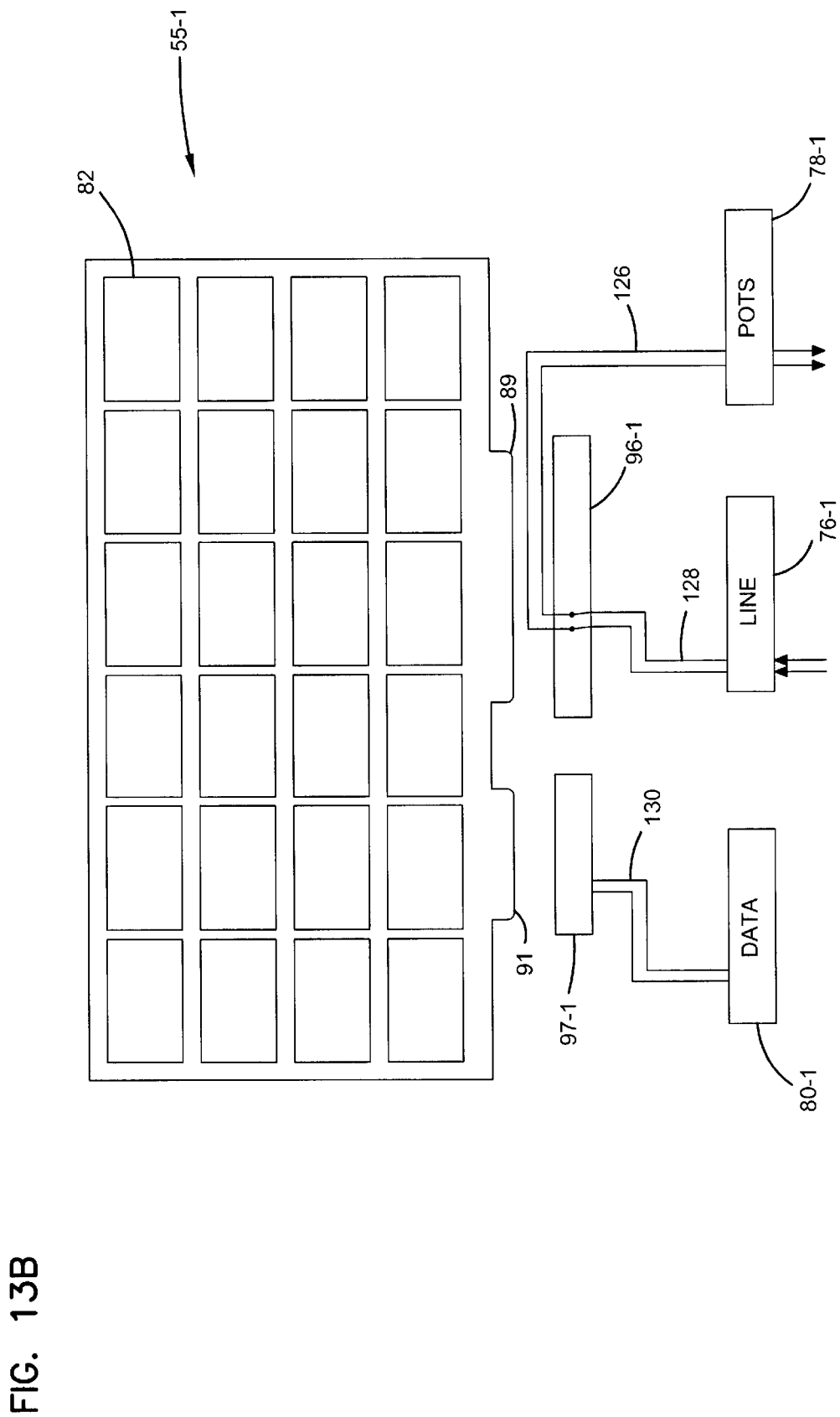
FIG. 13B is a schematic view of the circuit of FIG. 13A with the splitter card disconnected from the back plane of the splitter assembly of FIG. 3.

FIGS. 13A and 13B are additional schematic depictions of the tracing layout shown in FIG. 12. In FIG. 13A, the splitter card 55-1 is shown connected with card edge connectors 96-1 and 97-1. With the interface between the splitter card 55-1 and the card edge connectors 96-1 and 97-1, LINE signals inputted through LINE connector 76-1 are directed through tracings 128 to card edge connector 96-1. From card edge connector 96-1, the signal is conveyed to splitter 82 of splitter card 55-1. At splitter 82, the LINE signal is split into separate voice and data signals. The voice signal is directed back through card edge connector 96-1 to tracings 126. Tracings 126 carry the voice signal to POTS connector 78-1 where the voice signal is output from the splitter assembly 50. The data component of the LINE signal is directed from splitter 82 to card edge connector 97-1. From card edge connector 97-1, the data signal is carried by tracings 130 to data connector 80-1. At data connector 80-1, the data signal is output from the splitter assembly 50.

FIG. 13B shows the splitter card 55-1 disconnected from the card edge connectors 96-1 and 97-1. The splitter assembly 50 is preferably adapted for supporting lifeline functions. Therefore, the card edge connector 96-1 (which is representative of all of the card edge connectors 96-1 to 96-10) preferably includes contacts that automatically close upon removal of the splitter card 55-1 (i.e., the contacts are "normally closed"). When closed, the contacts provide electrical connections between the LINE tracings 128 and the POTS tracings 126. Thus, even when the card 55-1 is removed from the chassis 52, lifeline function is fully supported. Preferably, the contacts in the card edge connector 96-1 are "make-before-break" contacts which close before contact has been broken with the splitter card 55-1. Thus, lifeline functions are not interrupted even as the card 55-1 is in the process of being disconnected from the card edge connector 96-1.

An important consideration relating to the design of the tracing layout for the back plane circuit board 68 is the reduction of cross-talk. To reduce cross-talk, it is desirable to maintain a spacing of at least 0.04 inches between parallel portions of tracings corresponding to different circuits. This spacing can be reduced between layers through the use of grounding planes. It is also desirable to limit the crossing over of tracings of a given layer. To cross over tracings, vias (i.e., through holes) are used to allow the tracings to pass to a different layer. The use of vias increases the manufacturing complexity of the board and also reduces the usable area of the board thereby reducing the maximum possible circuit density of the board.

Preferably, the board 68 includes a plurality of layers (e.g., 28 or more layers) that are laminated together to form the board. Each layer preferably initially includes a dielectric support made of a material such as fiber-glass. A relatively thin conductive sheet or film made of an electrically conductive material such as copper is supported on the dielectric support. To form the tracings of the board, a conventional etching process is used to remove selected portions of the conductive sheet. Preferably, only a relatively small amount of the conductive sheet is removed. For example, only an amount sufficient to electrically isolate each of the tracings need be removed. Thus, a majority of the conductive sheet is preferably left on the support after the etching process has been completed. As described later in the specification, this remaining portion of conductive sheet can function as a grounding plane for preventing cross-talk between layers of the board 68 between which the grounding plane is positioned. Since the grounding plane and the tracings of a given layer are formed from a common conductive sheet, the tracings and the grounding plane are co-planar. Additionally, the grounding plane does not project outwardly from the dielectric support farther than the tracings. Thus, the grounding plane does not add any additional thickness to the layer.

Figure 14A:
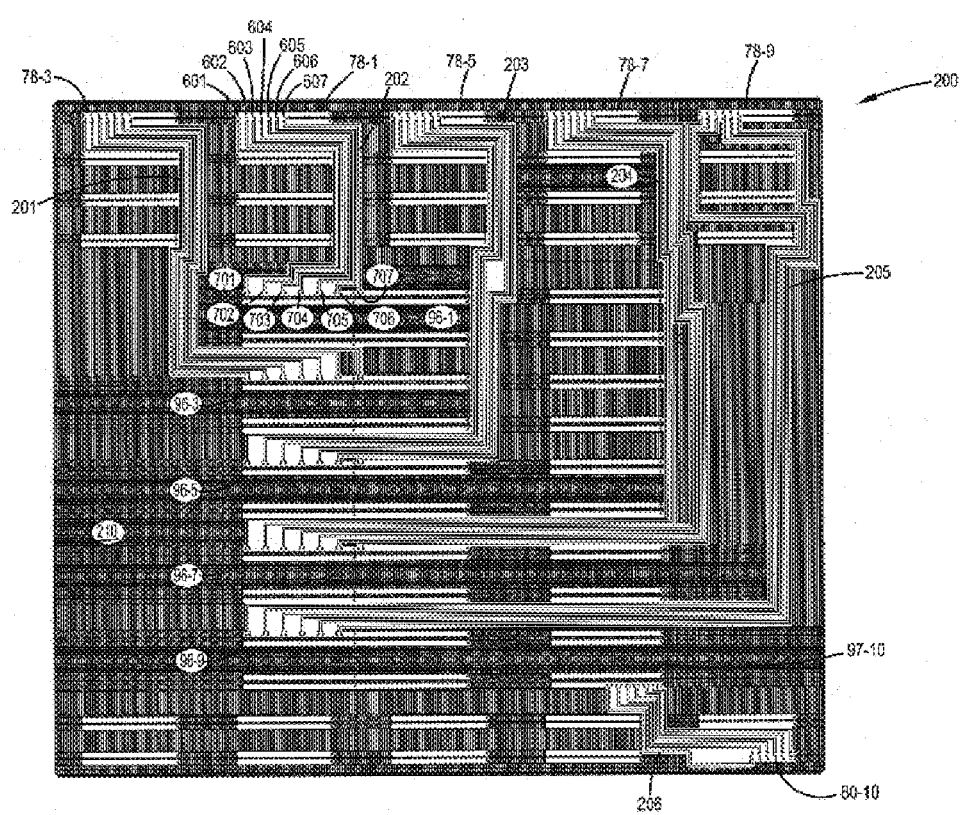
FIGS. 14A–C show exemplary tracing layouts for three consecutive layers of the back plane circuit board of the splitter assembly of FIG. 3.
Figure 14B:
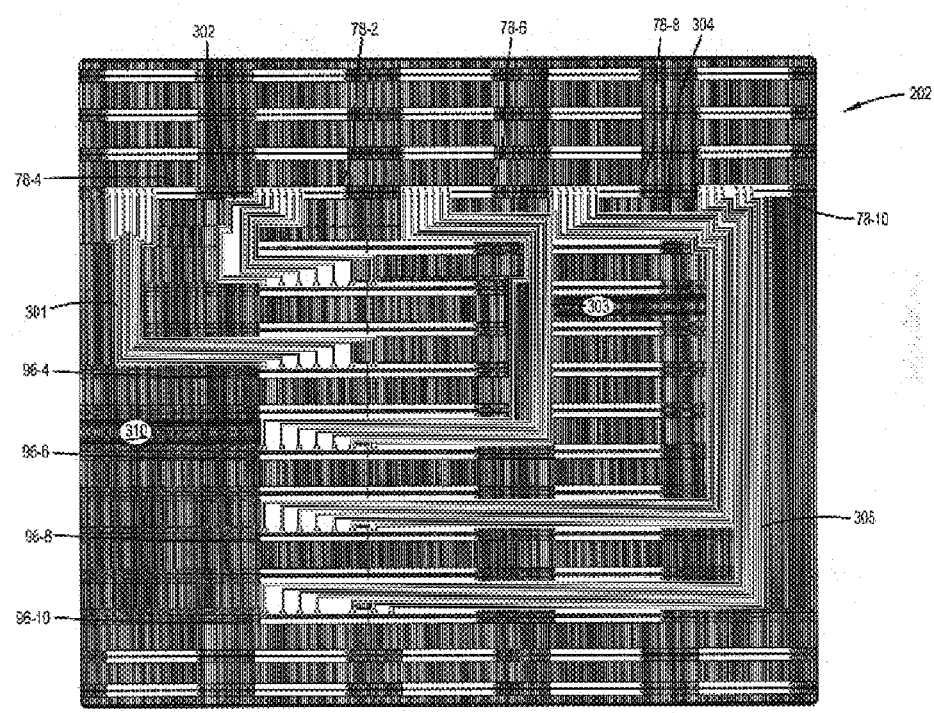
Figure 14C:
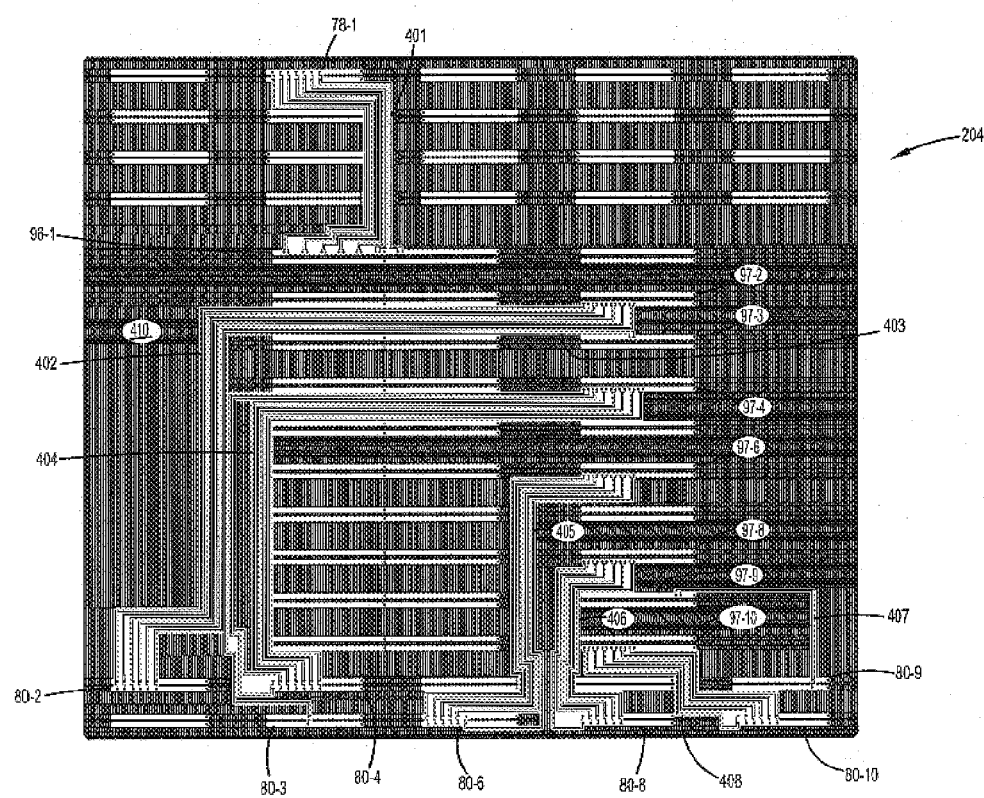

FIGS. 14A–14C show tracing layouts for exemplary layers of the back plane circuit board 68. The layers are 3 of many layers (e.g., 28 layers), and are shown for illustration purposes only. FIG. 14A shows a first layer 200, FIG. 14B shows a second layer 202 and FIG. 14C shows a third layer 204. When the circuit board 68 is assembled, the second layer 202 is preferably laminated directly between the first and third layers 200 and 204.

Referring to FIG. 14A, the depicted layer includes 6 groups of tracings 201–206. Group 201 electrically connects pads corresponding to POTS connector 78-3 to pads corresponding to card edge connector 96-3. Group 202 electrically connects pads corresponding to POTS connector 78-1 to pads corresponding to card edge connector 96-1. Group 203 electrically connects pads corresponding to POTS connector 78-5 to pads corresponding to card edge connector 96-5. Group 204 electrically connects pads corresponding to POTS connector 78-7 to pads corresponding to card edge connector 96-7. Group 205 electrically connects pads corresponding to POTS connector 78-9 to pads corresponding to card edge connector 96-9. Group 206 electrically connects pads corresponding to DATA connector 80-10 to pads corresponding to card edge connector 97-10. A ground plane 210 preferably covers a majority of the layer. The ground plane is preferably co-planar with and electrically isolated from (i.e., not in contact with) the tracings 201–206.

Referring to FIG. 14B, the depicted layer includes 5 groups of tracings 301–305. Group 301 electrically connects pads corresponding to POTS connector 78-4 to pads corresponding to card edge connector 96-4. Group 302 electrically connects pads corresponding to POTS connector 78-2 to pads corresponding to card edge connector 96-2. Group 303 electrically connects pads corresponding to POTS connector 78-6 to pads corresponding to card edge connector 96-6. Group 304 electrically connects pads corresponding to POTS connector 78-8 to pads corresponding to card edge connector 96-8. Group 305 electrically connects pads corresponding to POTS connector 78-10 to pads corresponding to card edge connector 96-10. A ground plane 310 preferably covers a majority of the layer. The ground plane is preferably co-planar with and electrically isolated from (i.e., not in contact with) the tracings 301–305.

Referring to FIG. 14C, the depicted layer includes 8 groups of tracings 401–408. Group 401 electrically connects pads corresponding to POTS connector 78-1 to pads corresponding to card edge connector 96-1. Group 402 electrically connects pads corresponding to DATA connector 80-2 to pads corresponding to card edge connector 97-2. Group 403 electrically connects pads corresponding to DATA connector 80-3 to pads corresponding to card edge connector 97-3. Group 404 electrically connects pads corresponding to DATA connector 80-4 to pads corresponding to card edge connector 97-4. Group 405 electrically connects pads corresponding to DATA connector 80-6 to pads corresponding to card edge connector 97-6. Group 406 electrically connects pads corresponding to DATA connector 80-8 to pads corresponding to card edge connector 97-8. Group 407 electrically connects pads corresponding to DATA connector 80-9 to pads corresponding to card edge connector 97-9. Group 408 electrically connects pads corresponding to DATA connector 80-10 to pads corresponding to card edge connector 97-10. A ground plane 410 preferably covers a majority of the layer. The ground plane is preferably co-planar with and electrically isolated from (i.e., not in contact with) the tracings 401–408.

Referring still to FIGS. 14A–14C, each of the groups of tracings 201–206, 301–305 and 401–408 includes tracings that are generally parallel to one another. Preferably, a spacing of at least 0.04 inches is maintained between parallel portions of each pair of tracings. A typical layer thickness is about 0.008 inches. Therefore, the tracings of adjacent layers have parallel portions that are preferably offset from one another by distances sufficient to maintain spacings of at least 0.04 inches between the tracings. For example, if FIGS. 14A and 14B are overlaid, it is noted that all of the horizontal portions of tracings 201–206 are vertically offset from all of the horizontal portions of tracings 301–305, and all of the vertical portions of tracings 201–206 are laterally offset from all of the vertical portions of tracings 301–305. Similarly, all of the horizontal portions of tracings 301–305 are preferably vertically offset from all of the horizontal portions of tracings 401–408, and all of the vertical portions of tracings 301–305 are preferably laterally offset from all of the vertical portions of tracings 401–408.

A typical layer thickness for each of the layers of the circuit board 68 is about 0.008 inches. Thus, prevention of cross-talk is also a concern for non-adjacent layers (i.e., layers separated by one or more layers) because parallel portions of tracings corresponding to non-adjacent layers can be spaced less than 0.04 inches apart. The issue of cross-talk between non-adjacent layers is addressed through the use of the grounding planes 210, 310 and 410. The grounding planes 210, 310 and 410 function as barriers for the prevention/reduction of cross-talk. For example, if FIGS. 14A and 14C are overlaid, it is noted that the vertical and horizontal portions of tracings 202 and 401 are not offset by a distance greater than 0.04 inches. However, the intermediate grounding plane 310 of the layer of FIG. 14B separates and isolates the tracings 202 and 401 thereby reducing or preventing cross-talk between the tracings. Advantageously, the grounding plane 310 prevents excessive cross-talk without increasing the thickness of the board 68. Preferably, lamination adhesive prevents electric contact between the grounding plane 310 and the tracings 202 and 401.

It is preferred for the 24 available contact pairs of each POTS connector to be electrically connected to the same 24 contact pairs of the corresponding LINE connector (e.g., contacts 1&26 of POTS connector 78-1 are electrically connected to contacts 1&26 of LINE connector 76-1, contacts 2&27 of POTS connector 78-1 are electrically connected to contacts 2&27 of LINE connector 76-1, etc.).

Figure 15:
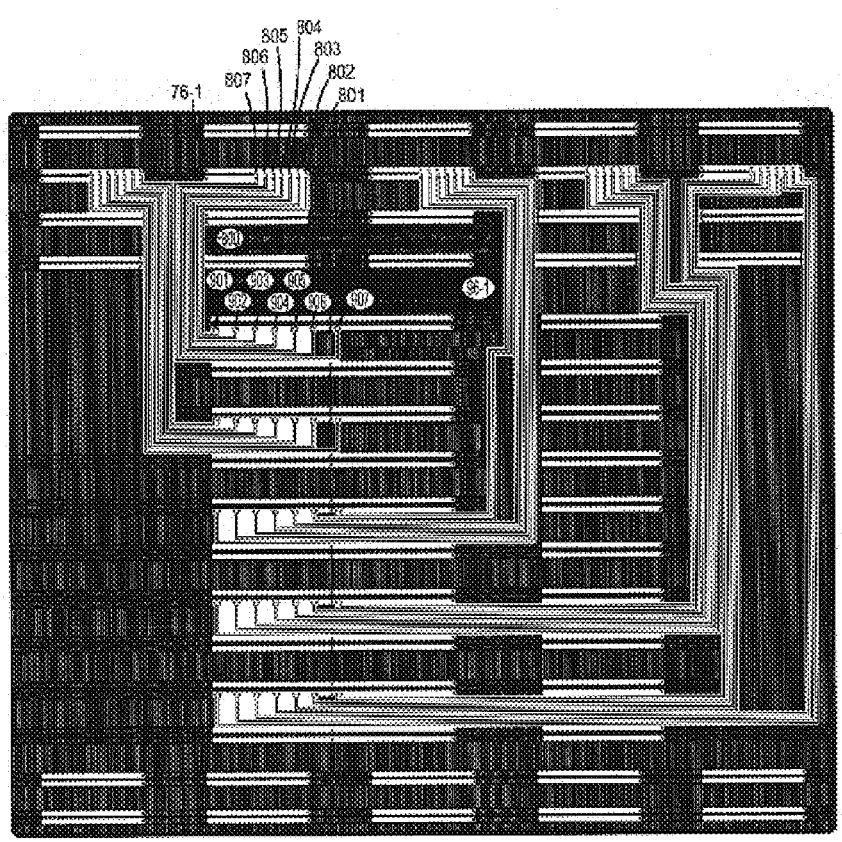
FIG. 15 shows an exemplary tracing layout for another layer of the back plane circuit board of the splitter assembly of FIG. 3.

FIG. 15 shows another layer of the board 68. In the layer of FIG. 15, 7 pairs of tracings 800 are shown electrically connecting 7 pairs of contacts 801–807 of LINE connector 76-1 with corresponding contact pairs 901–907 of card edge connector 96-1. The contact pairs 801–807 respectively include contacts 1&26, contacts 3&28, contacts 5&30, contacts 7&32, contacts 9&34, contacts 11&36 and contacts 13&38 of LINE connector 76-1. As indicated above, it is desirable for the contact pairs of each POTS connector to be electrically connected to the same contact pairs of the corresponding LINE connector. Thus, it is preferred for the 7 depicted contact pairs 801–807 of LINE connector 76-1 to be electrically connected to the same 7 contact pairs of POTS connector 78-1.

FIG. 14A shows 7 contact pairs 601–607 of POTS connector 78-1. The contact pairs 601–607 respectively include contacts 1&26, contacts 3&28, contacts 5&30, contacts 7&32, contacts 9&34, contacts 11&36 and contacts 13&38 of POTS connector 78-1. Tracings 202 electrically connect contact pairs 601–607 with corresponding contact pairs 701–707 of card edge connector 96-1. Contacts 701–707 respectively oppose contacts 901–907 (shown in FIG. 15) of card edge connector 96-1 such that an electrical interface can be provided between the contacts. Thus, contact pairs 801–807 of LINE connector 76-1 are electrically connected to contact pairs 601–607 of POTS connector 78-1 by circuits that pass though card edge connector 96-1.

As shown in FIGS. 14A and 15, uniform spacings are maintained between the pairs of tracings 202 and are also maintained between the pairs of tracings 800. To maintain the desired spacing between tracings 202 and 800, the tracings 202 and 800 preferably have a "cascading" configuration as the tracings transition from horizontal to vertical and from vertical to horizontal. It will be appreciated that the contact pairs of the other POTS and LINE connectors 78-1 to 78-10 and 76-1 to 76-10 are connected to card edge connectors 96-1 to 96-10 in a similar manner by tracings on one or more other layers.

Referring to FIG. 14A, it is noted that tracings 202 do not cross over each other as the tracings extend from contact pairs 601–607 of POTS connector 78-1 to contact pairs 701–707 of card edge connector 96-1. Similarly, as shown in FIG. 15, tracings 800 do not cross over each other as the tracings extend from contact pairs 801–807 of LINE connector 76-1 to contact pairs 901–907 of card edge connector 96-1. The crossing over of tracings is prevented by inverting the POTS connector 78-1 relative to the LINE connector 76-1. If the connectors 76-1 and 78-1 were positioned in the same orientation, the tracings corresponding to one of the connectors would need to crossover each other to reach the desired contact pairs of card edge connector 96-1. Such crossing over typically requires the use of vias, which complicate the board manufacturing process. This type of tracing configuration is also preferably used for the remaining contact pairs of connectors 76-1 and 78-1 as well as the contact pairs of the other connector sets 78-2 to 78-10 and 76-2 to 76-10.

VII. Manufacturing Efficiency and Circuit Density

Circuit density is an important factor that is preferably considered in the design of a splitter assembly. The size of a given splitter assembly chassis is at least partially dictated by the size of the rack or cabinet in which the chassis is to be mounted. Racks and cabinets have conventional sizes. For example, a conventional European Telecommunications Standards Institute (EDSI) cabinet has a bay width w (shown in FIG. 10) of 444.5 millimeters (mm) and a depth of either 300 or 600 millimeters. One embodiment of a splitter chassis constructed in accordance with the principles of the present invention has a depth d (shown in FIG. 10) less than 300 mm, a card housing chamber width w1 (shown in FIG. 10) less than 444.5 mm, a height h (shown in FIG. 10) less than or equal to 406 mm and a circuit capacity equal to or greater than 240 circuits. Another embodiment of a splitter chassis constructed in accordance with the principles of the present invention has a depth d less than 300 mm, a card housing chamber width w1 less than 444.5 mm, a height h less than or equal to 381 mm and a circuit capacity equal to or greater than 240 circuits. It is preferred for the depth of the chassis to be less than 300 mm. This allows the chassis to be used with a cabinet having a depth of 300 mm, and also allows two chassis to be mounted back-to-back in a cabinet or rack having a depth of 600 mm.

The various aspects of the present invention provide a splitter assembly having a relatively low number of parts, which is relatively light and can be easily and quickly assembled. Further, the various aspects of the present invention assist in simplifying the manufacturability and increasing the circuit density of the splitter assembly. For example, by mounting the LINE connectors 76-1 to 76-10, the POTS connectors 78-1 to 78-10, the DATA connectors 80-1 to 80-10, the first card edge connectors 96-1 to 96-10 and the second card edge connectors 97-1 to 97-10 all in a generally horizontal orientation, the height of the chassis can be reduced. This configuration also facilitates providing an efficient tracing layout for the back plane circuit board 68. Similarly, the tracing layout of the board 68 is also simplified by inverting selected POTS and LINE connectors relative to one another.

A number of components disclosed in this specification are described as being "horizontal" in orientation. It will be understood that the phrase "horizontal" orientation or like phrases mean that the components are generally horizontally aligned when their corresponding splitter chassis is mounted in a rack or cabinet.

With regard to the foregoing description, it is to be understood that changes may be made in detail without departing from the scope of the present invention. It is intended that the specification and depicted aspects of the invention may be considered exemplary, only, with a true scope and spirit of the invention being indicated by the broad meaning of the following claims.

What is claimed is:

1. A telecommunications device comprising:

a plurality of splitter cards;

a chassis including a card housing in which the splitter cards are mounted, the card housing defining an access opening for allowing the splitter cards to be inserted into or removed from the card housing;

a circuit board that defines a backplane of the chassis;

a plurality of card edge connectors for providing electrical connections between the splitter cards and the circuit board;

POTS connectors, LINE connectors and DATA connectors;

the circuit board including a first layer having first tracings that electrically connect contacts of at least one of the POTS, LINE or DATA connectors to at least one of the card edge connectors;

the circuit board including a second layer having second tracings that electrically connect contacts of at least one of the POTS, LINE or DATA connectors to at least one of the card edge connectors;

the circuit board including a third layer having third tracings that electrically connect contacts of at least one of the POTS, LINE or DATA connectors to at least one of the card edge connectors; and the second layer being positioned between the first and third layers, a majority of the second layer including a grounding plane that is co-planar with the second tracings such that the grounding plane adds no additional thickness to the second layer, the grounding plane being positioned between the first and third tracings to reduce cross-talk between the first and third tracings.

2. The telecommunications device of claim 1, wherein the first and third tracings are separated by a distance less than 0.04 inches.

3. The telecommunications device of claim 2, wherein the second layer has a thickness of about 0.008 inches.

4. The telecommunications device of claim 1, wherein the POTS, LINE and DATA connectors are RJ21 connectors.

5. The telecommunications device of claim 1, wherein the POTS, LINE and DATA connectors are multi-pin connectors adapted for use with multi-pair cables.

6. A circuit board device comprising:
   a circuit board including a first layer including first tracings, a second layer including second tracings and a third layer including third tracings, the second layer being positioned directly between the first and third layers; and
   the second layer including a grounding plane, the grounding plane and the second tracings being formed from a common sheet of conductive material such that the grounding plane adds no additional thickness to the second layer, and the grounding plane being positioned between the first and third tracings to reduce cross-talk between the first and third tracings.

7. The telecommunications device of claim 6, wherein the first and third tracings are separated by a distance less than 0.04 inches.

8. The telecommunications device of claim 7, wherein the second layer has a thickness of about 0.008 inches.

9. The telecommunications device of claim 6, further comprising telecommunications connectors electrically connected to the first, second and third tracings.

10. The telecommunications device of claim 9, wherein the telecommunications connectors include RJ21 connectors.

11. The telecommunications device of claim 9, wherein the telecommunication connectors include card edge connectors.

12. The telecommunications device of claim 9, wherein the telecommunications connectors include multi-pin connectors adapted for use with multi-pair cables.

13. The telecommunications device of claim 9, wherein the telecommunications connectors include POTS, LINE and DATA connectors.

14. A method for reducing cross-talk between first and second tracings provided on first and second different layers of a circuit board, the method comprising:
   providing an intermediate layer having a film of conductive material;
   removing a portion of the film such that remaining portions of the film define a plurality of third tracings and also define a grounding plane, the grounding plane being electrically disconnected from the third tracings;
   positioning the intermediate layer between the first and second layers with the grounding plane positioned between the first and second tracings.

15. The method of claim 14, further comprising laminating the intermediate layer between the first and second layers.

16. The method of claim 14, wherein a spacing of less than 0.04 inches is provided between the first and second tracings.

* * * * *

UNITED STATES PATENT AND TRADEMARK OFFICE
CERTIFICATE OF CORRECTION

PATENT NO. : 6,804,353 B2  Page 1 of 1
APPLICATION NO. : 09/896809
DATED : October 12, 2004
INVENTOR(S) : Schmokel It is certified that error appears in the above-identified patent and that said Letters Patent is hereby corrected as shown below:

Front Cover, (57) ABSTRACT, line 2:   "a circuit board, and plurality" should read --a circuit board, a plurality--

Front Cover, (57) ABSTRACT, line 12:   "adds additional" should read --adds no additional--

Signed and Sealed this

Twenty-second Day of August, 2006

JON W. DUDAS
*Director of the United States Patent and Trademark Office*